(12) United States Patent
Lan et al.

(10) Patent No.: US 11,577,469 B2
(45) Date of Patent: Feb. 14, 2023

(54) 3D PRINTER

(71) Applicant: Shanghai Mi Fang Electronics Ltd., Shanghai (CN)

(72) Inventors: He Lan, Shanghai (CN); Huancheng Shi, Shanghai (CN)

(73) Assignee: Shanghai Mi Fang Electronics Ltd., Shanghai (CN)

( * ) Notice: Subject to any disclaimer, the term of this patent is extended or adjusted under 35 U.S.C. 154(b) by 328 days.

(21) Appl. No.: 16/882,090

(22) Filed: May 22, 2020

(65) Prior Publication Data

US 2020/0282659 A1  Sep. 10, 2020

Related U.S. Application Data

(63) Continuation-in-part of application No. 16/215,527, filed on Dec. 10, 2018, now abandoned, which is a
(Continued)

(30) Foreign Application Priority Data

Aug. 10, 2017 (CN) .......................... 201710682344.9

(51) Int. Cl.
  *B29C 64/393* (2017.01)
  *B33Y 30/00* (2015.01)
  (Continued)

(52) U.S. Cl.
  CPC .......... *B29C 64/393* (2017.08); *B29C 64/236* (2017.08); *B29C 64/241* (2017.08);
  (Continued)

(58) Field of Classification Search
  CPC ....... B29C 64/259; B29C 64/321; B41J 29/17
  See application file for complete search history.

(56) References Cited

U.S. PATENT DOCUMENTS 5,207,371 A * 5/1993 Prinz ........................ B23K 9/04
                                                     228/159
5,894,793 A * 4/1999 Sakai ..................... B41F 15/423
                                                     101/127.1
(Continued)

FOREIGN PATENT DOCUMENTS

CN          103786347 A      5/2014
CN          203805507 U      9/2014
(Continued)

*Primary Examiner* — Leith S Shafi
*Assistant Examiner* — Nicholas J Chidiac
(74) *Attorney, Agent, or Firm* — Mei & Mark LLP; Manni Li

(57) ABSTRACT

Full-automatic microelectronic printer comprising a printing platform, a control component, a feeding component, a camera component, a machine vision device, an ink droplet observation device, and a CAD/CAM system. The printing platform comprises a four-axis linkage system, a printing worktable, a base, a protective housing, an automatic ink cartridge turning device, and an automatic cleaning device; the feeding component comprises a switching control device, an ink cartridge, and an auxiliary processing component; the control component comprises a core control integrated circuit board, a plurality of drive control circuit boards, and a control module interface. The feeding component switches the ink cartridges and the auxiliary processing components to the printing platform in response to the control component which drives the ink cartridges and auxiliary processing components to print, and the protective housing removes fine particles and gas odors. CAD/CAM system assists in designing, generating, and sending instruction to the control component, printing platform, and feeding component to operate and realize full-automatic multi-layer printing.

12 Claims, 8 Drawing Sheets

Related U.S. Application Data continuation of application No. PCT/CN2018/097018, filed on Jul. 25, 2018.

(51) Int. Cl.
| | |
|---|---|
| *B33Y 40/00* | (2020.01) |
| *B33Y 50/02* | (2015.01) |
| *B29C 64/364* | (2017.01) |
| *B29C 64/236* | (2017.01) |
| *B29C 64/25* | (2017.01) |
| *B29C 64/295* | (2017.01) |
| *B29C 64/35* | (2017.01) |
| *B29C 64/241* | (2017.01) |

(52) U.S. Cl.
CPC ............ *B29C 64/25* (2017.08); *B29C 64/295* (2017.08); *B29C 64/35* (2017.08); *B29C 64/364* (2017.08); *B33Y 30/00* (2014.12); *B33Y 40/00* (2014.12); *B33Y 50/02* (2014.12)

(56) References Cited

U.S. PATENT DOCUMENTS

| | | | |
|---|---|---|---|
| 9,315,057 B2* | 4/2016 | Kanemoto | B41J 29/17 |
| 9,902,112 B2* | 2/2018 | El-Siblani | B29C 64/135 |
| 10,119,107 B2* | 11/2018 | Tavana | B29C 64/112 |
| 11,420,382 B2* | 8/2022 | Mark | B33Y 50/02 |
| 2004/0003738 A1* | 1/2004 | Imiolek | B33Y 30/00 |
| | | | 101/480 |
| 2005/0225007 A1* | 10/2005 | Lai | G05B 19/4099 |
| | | | 425/375 |
| 2007/0209179 A1* | 9/2007 | Williams | B23F 21/005 |
| | | | 29/27 C |
| 2012/0176445 A1* | 7/2012 | Kataniwa | B41J 2/16508 |
| | | | 347/32 |
| 2014/0198161 A1* | 7/2014 | Kanemoto | B41J 29/17 |
| | | | 347/101 |
| 2014/0328963 A1* | 11/2014 | Mark | B33Y 50/02 |
| | | | 425/143 |
| 2015/0037445 A1* | 2/2015 | Murphy | B29C 64/393 |
| | | | 425/131.1 |
| 2016/0083681 A1* | 3/2016 | Tavana | C12M 21/08 |
| | | | 425/162 |
| 2016/0297141 A1* | 10/2016 | El-Siblani | B29C 64/135 |
| 2018/0079153 A1* | 3/2018 | Ng | B29C 64/209 |

FOREIGN PATENT DOCUMENTS

| | | |
|---|---|---|
| CN | 106426931 A | 2/2017 |
| CN | 206048830 U | 3/2017 |
| JP | 2004017331 A | 1/2004 |
| JP | 2017071067 A | 4/2017 |

* cited by examiner

# 3D PRINTER

CROSS-REFERENCE TO RELATED APPLICATIONS

The subject application is a continuation-in-part of U.S. patent application Ser. No. 16/215,527 filed on Dec. 10, 2018, which in turn is a continuation of PCT/CN2018/097018 filed on Jul. 25, 2018 and claims priority on Chinese patent application CN201710682344.9 filed on Aug. 10, 2017 in China. The contents and subject matter of all the priority applications are incorporated herein by reference.

TECHNICAL FIELD

The present invention relates to three-dimensional printing, particularly, full-automatic microelectronic printer for three-dimensional printing and producing semiconductor products.

BACKGROUND ART

Three-dimensional (3D) printing is an additive manufacturing technology characterized in that a three-dimensional model designed by a computer modeling software is layered into a multi-layer two-dimensional section by a slicing software, and a printer is used for forming materials layer by layer via multi-layer printing to manufacture a three-dimensional part. Common three-dimensional printing techniques include Fused Deposition Modeling (FDM); Dispensing, Coating, Stereolithography Appearance (SLA); Three Dimensional Printing (3DP); and the like. Generally, a three-dimensional printer only applies one of the printing techniques but never produces a product by combining different techniques and advantages. On the other hand, in the field of flexible semiconductor manufacturing, the printing of carbon-based or organic semiconductor microelectronic products is required to have varieties of materials and printing processes so that the existing microelectronic printers cannot meet the requirements of flexible semiconductor device manufacturing.

Print Full Electronic Technology refers to a process where ink solutions of nano-materials and carbon-based or organic semiconductor materials are used to form multi-layer conductive traces and patterns on a substrate (without a copper foil) or an entire multi-layer printed circuit board by using a variety of printing processes such as rapid, efficient, and flexible Digital Printing inkjet Technology, Dispensing and Coating.

Previously, electronic systems have been produced by purchasing various devices fabricated in large semiconductor factories, followed by fabricating the corresponding boards through PCB process, and finally mounting individual devices onto the PCB to form a usable system. Now with the development of new materials such as nano-materials and organic semiconductors, device manufacturing no longer requires high-temperature, vacuum, and other conditions that only large factories can afford, and the devices can be fabricated in an inexpensive and simple way, which uses full ink solution processing and printing in an indoor environment.

Current market-oriented microelectronic printers generally include components such as manually replaceable ink cartridges, movable three-axis platforms, printheads, ink drop viewing, surface adsorption and heating devices, but are unable to achieve full automatic multi-layer alignment and automatic ink cartridge replacement, thereby resulting in the inability to fully automatically print more than one layer of any device, such as transistors, organic light emitting diodes, and the like, and the incapability to fabricate electronic systems based on such devices.

SUMMARY OF THE INVENTION

The present invention provides a full-automatic microelectronic printer to solve the technical problem that flexible microelectronic parts and components of multi-layer materials or multi-layer circuits can be full-automatically printed only by a single printing process but not by multiple printing processes in the prior art.

The present invention provides a full-automatic microelectronic printer comprising a printing platform, a control component, and a feeding component.

In the present invention, the printing platform comprises a four-axis linkage system, a printing worktable, and a base. The four-axis linkage system is arranged on the base and comprises a rotating motor slide module capable of performing rotating motion, an X-axis linear motor slide module, a Y-axis linear motor slide module, and a Z-axis linear motor slide module, and the X-, Y-, and Z-axis linear motor slide modules are perpendicular to one another and capable of performing a three-dimensional space motion. The rotating motor slide module is arranged on the base and comprises a rotating support and a rotating motor. The X-axis linear motor slide module is arranged on the base and comprises an X-axis slide support; the Y-axis linear motor slide module is arranged on the base and comprises a Y-axis slide support; and the Z-axis linear motor slide module is arranged on the X-axis slide support and comprises a Z-axis annular support.

In the present invention, the printing worktable is arranged on the four-axis linkage system for placing a substrate material of a printed flexible microelectronic device with leveling-free performance; and the printing worktable is an integral structure and comprises a working surface panel, a heating device, a vacuum adsorption device, a cushion elastic washer and a cushion subplate. The working surface panel is arranged on an uppermost layer, a plurality of small holes which are uniformly arrayed are arranged on the working surface panel for ventilation, and an X-Y direction reference positioning plate is arranged on one side edge of the working surface panel for accurately positioning the substrate material. The heating device comprises a heating coil and a temperature sensor that are arranged at the bottom of the working surface panel for heating printing ink and the substrate material. The vacuum adsorption device is comprises at least two heat insulation plates stacked and fixedly connected below the working surface panel for adsorbing and fixing the substrate material, wherein a rectangular hole covering all small holes in the working surface plate is arranged in the middle of the heat insulation plate close to the working surface plate, so that a sealed hollow cavity is formed between the heat insulation plate at a bottommost layer and the working surface plate, and the sealed hollow cavity is communicated with an external air source by an air pipe to form a negative air pressure in the hollow cavity so as to smoothly adsorb the substrate material via the small holes. The cushion subplate is positioned at lowest layer and fixedly connected to the Y-axis slide support, and is sequentially fixedly connected with the heat insulation plate and the working surface panel from bottom to top, and the cushion elastic washer is clamped between the heat insulation plate and the cushion subplate so as to form a gap for preventing heat conduction therebetween.

In the present invention, the feeding component is arranged in parallel on one side of the printing platform and comprises a switching control device, a plurality of ink cartridges and a plurality of auxiliary processing components for automatically switching the ink cartridges with different ink solutions and the auxiliary processing components with different process functions to be sent to the printing platform. The switching control device comprises a driving motor, a circular turntable positioned in the center, an electric telescopic rod positioned above the circular turntable and a clamping mechanism. The circular turntable is driven by the driving motor to make 360-degree free rotation around a center axis, at least 16 engagement slots are arranged on the circular turntable, and a plurality of ink cartridges containing ink solutions with different material properties and auxiliary processing components with different printing process functions are arranged in the engagement slots. The ink cartridge comprises an inkstand and a printhead which are connected with each other, the auxiliary processing component comprises an inkstand and an auxiliary processing head which are connected with each other, the shape of the auxiliary processing component is the same as that of the ink cartridge, and the auxiliary processing component can be interchangeably installed with the ink cartridge. The electric telescopic rod moves linearly along the X-axis direction to convey the ink cartridge or the auxiliary processing component, and the clamping mechanism is fixedly arranged at a front end of the electric telescopic rod and is used for clamping and fixing the ink cartridge or the auxiliary processing component.

In the present invention, the control component is arranged on the base of the printing platform and connected with the printing platform and the feeding component for controlling the feeding component to switch and move different ink cartridges or auxiliary processing components to the printing platform, and controlling the printing platform to realize corresponding inkjet printing or auxiliary process treating operations so as to complete three-dimensional full-automatic printing of the multi-layer flexible microelectronic device. The control component comprises a core control integrated circuit board of a multi-core central processing unit, and a process drive circuit board, a motion drive circuit board, a control circuit board, a power supply module, an air pressure control module, a power interface, a power switch, and a plurality of communication interfaces coupled with the core control integrated circuit board. The process drive circuit board is connected with the ink cartridge and the auxiliary processing component for driving the inkjet printing and the auxiliary processing process. The motion drive circuit board is connected with the four-axis linkage system and the switching control device for driving the three-dimensional four-axis motion of the printing worktable and the switching transfer motion of the ink cartridge or the auxiliary processing component. The control circuit board is connected with the heating device for controlling the heating processing of the substrate material. The power supply module is connected with the power interface and the power switch for controlling the on-off of the power supply. The air pressure control module is connected with the vacuum adsorption device for controlling adsorption and fixation to the substrate material.

The present invention has the following advantages over the current technology.

(1) The present invention provides a computer-aided design and manufacturing system, has the functions of designing semiconductor electronic parts and components and multi-layer integrated circuit structure diagrams, can design ink solution materials, substrate materials and multiple printing process parameters including heating, air pressure, ultraviolet and infrared illumination, printing speed, printing precision, driving waveforms, camera parameters and the like, convert the related parameters of drawings and the printing process by an algorithm program to generate printing data, and the same to a control component so as to control an automatic operation of the printer, thereby completing the three-dimensional space automatic printing function of the flexible microelectronic device which needs multiple printing processes.

(2) A switching control device of a feeding component has interchangeability, and can automatically switch an ink cartridge where the corresponding ink solution is located or an auxiliary processing component according to the current printing requirement, so that different ink cartridges and different auxiliary processing components can realize mutual switching, and can complete different printing processes and auxiliary processing.

(3) A printing platform can realize the process functions of inkjet printing, heating, adsorption, illumination, ozone processing, printhead cleaning, dispensing and scraping automatically in the whole process.

(4) An inkjet protection device can keep the inside of the printhead wet so as to prevent the orifice from being blocked after the ink solution is dried.

(5) A camera component and a machine vision device are capable of automatically correcting position errors of the printhead, automatically aligning the positions of the multi-layer print reference points, monitoring print errors occurring during inkjet printing, and correcting or re-performing erroneous printing steps.

(6) The present invention has a printing multi-layer structure, realizes various printing processes and various auxiliary treatment processes, and can complete full-automatic inkjet printing of carbon-based or organic semiconductor electronic parts and components of multi-layer materials or multi-layer circuits.

Figure 1:
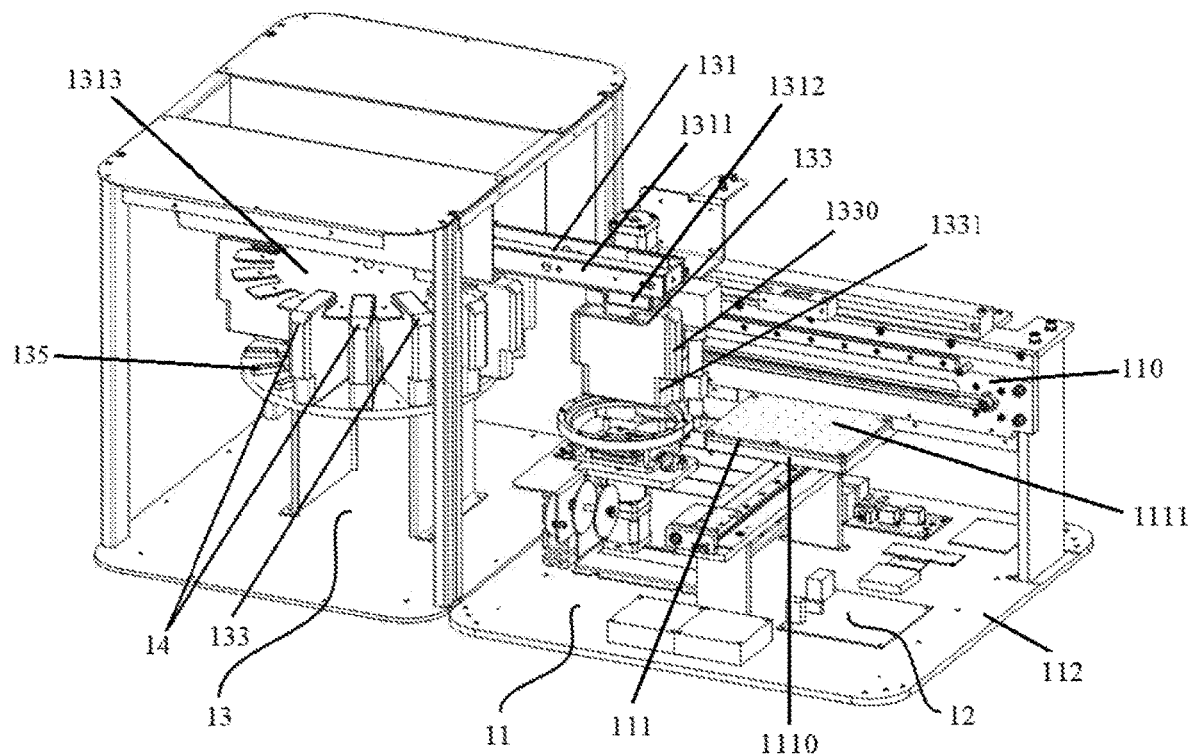
FIG. 1 is a structurally schematic diagram showing the first embodiment of the present invention.

Reference numbers in the drawings are used as follows: 11—a printing platform, 110—a four-axis linkage system, 1105—a Z-axis annular support, 1107—a rotating support, 1108—a rotating motor, 1110—a vacuum adsorption device, 1111—a printing worktable, 1112—a working surface panel, 1113—a heat insulation plate, 1114—a cushion elastic washer, 1115—a cushion subplate, 1116—a small hole, 1117—a limit bolt, 111—a heating device, 112—a base, 113—a protective housing, 1131—an inlet filtering component, 1132—an outlet filtering component, 114—an elastic foot, 12—a control component, 13—a feeding component, 131—a switching control device, 1311—an electric telescopic rod, 1312—a clamping mechanism, 1313—a circular turntable, 133—an ink cartridge, 1330—an ink tank, 1331—a printhead, 135—an inkjet protection device, 14—an auxiliary processing component, 15—a camera component, 16—an ink droplet observation device, 17—an rotary cleaning member of the ink cartridge, 1701—an upper cleaning pulley, 1702—a lower cleaning pulley, 1703—a direct current motor, 1704—a cleaning belt, 1705—an ink cartridge rotating disk, 1706—a cylindrical pin, 1707—an ink cartridge pedestal, 18—an automatic ink cartridge turning device, 1801—a stepping motor, 1802—a pinion, 1803—a pressing sheet, 1804—a scale sheet, 1805—a big gear, 1806—a screw, 1807—a small scale sheet, 1808—an ink cartridge fixing pedestal, 1809—a limiting sheet, 1810—a photoelectric induction switch, and 19—an automatic cleaning device.

DETAILED DESCRIPTION OF THE INVENTION

The present invention is described in details in the following embodiments, but the embodiments shall not be used to limit to the scope of protection for the invention.

In the present invention, "circuit" refers to a conductive loop formed by connecting at least one component or subcircuit through electrical or electromagnetic connection. When a component or circuit is referred to as "connected to" another component or the component/circuit is "connected" between the two nodes, it can be directly coupled or connected to the other component or intermediate components can be existed, and connections of components can be physical, logical, or a combination thereof. In contrast, when a component is referred to as "directly coupled" or "directly connected" to another component, it is meant that there are no intermediate components.

Unless clearly required by the context otherwise, "including," "comprising," and the like should be interpreted as meanings of contain rather than exclusive or exhaustive, that is, the meaning of "including but not limited to."

In the present invention, the terms "first," "second," and the like are used for descriptive purposes only and are not to be construed as indicating or implying relative importance. Further, in description of the present invention, "a plurality" means two or more unless otherwise stated.

The present invention provides a microelectronic printer which comprises a computer-aided design and manufacturing system (hereinafter referred to as a CAD/CAM system) and an automatic printing platform and an automatically-operated feeding component. The printer of the present invention solves the technical problem that flexible microelectronic parts and components of multi-layer materials or multi-layer circuits can be full-automatically printed only by a single printing process but not by multiple printing processes in the prior art by using multiple printing technologies and a full-automatic printing process technology. The present invention provides a unique and valuable solution to the full-automatic printing process technology using multiple printing technologies.

Figure 2:
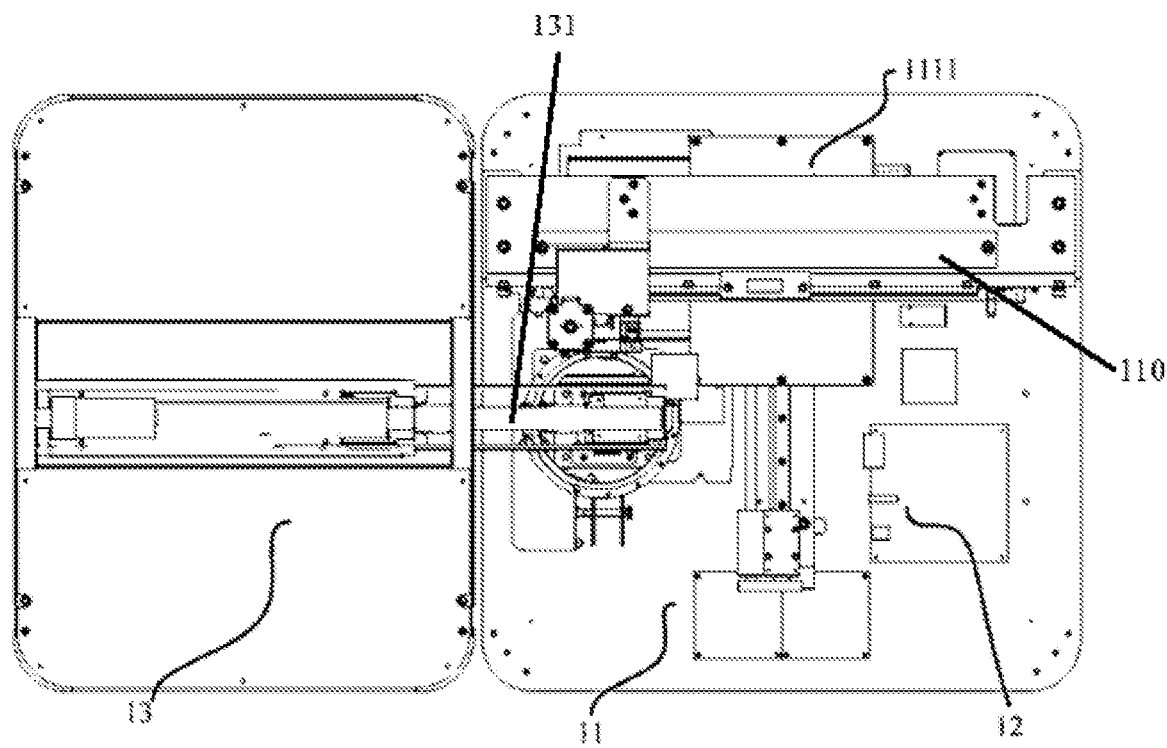
FIG. 2 is a top view of the first embodiment of the present invention.

In the first embodiment of the present invention as shown in FIGS. 1 and 2, the microelectronic printer includes a printing platform 11, a control component 12, and a feeding component 13.

The printing platform 11 is used for realizing functions of a plurality of fully automatic printing processes of mechanical motion, air pressure, heating, ultraviolet irradiation, ozone generation processing, visual image shooting, air filtering and the like of the microelectronic printer, and structurally comprises a four-axis linkage system 110, a printing worktable 1111 and a base 112, wherein the four-axis linkage system 110 is arranged on the base 112.

In the embodiment, the four-axis linkage system 110 includes an X-axis linear motor slide module, a Y-axis linear motor slide module, a Z-axis linear motor slide module, a Z-axis linear motor slide module and a rotating motor slide module configured as a three-dimensional Cartesian three-axis coordinate system; a photoelectric sensor, a distance sensor, a grating, a support fixing piece and other structural parts are further arranged in the four-axis linkage system 110, so that high-precision motion support is provided for the printer to realize various printing processes. It will be apparent to those skilled in the art that the grating may also be replaced with a magnetic grating or encoder to provide a motion feedback signal. The X-axis linear motor slide module, the Y-axis linear motor slide module and the Z-axis linear motor slide module are vertically arranged with each other, wherein the X-axis linear slide module and the Y-axis linear motor slide module are arranged on the base 112, the X-axis linear slide module comprises an X-axis slide support, and the Y-axis linear motor slide module comprises a Y-axis slide support; the Z-axis linear motor slide module is arranged on an X-axis slide support of the X-axis linear motor slide module and comprises a Z-axis annular support 1105. The rotating motor slide module is mounted on the base 112 for rotational movement and includes a rotating support 1107 and a rotating motor 1108. The four-axis linkage system 110 supports various high-precision motions of the printer, with repeated positioning accuracy of ±20 microns and grating feedback accuracy of ±5 microns.

Figure 3:
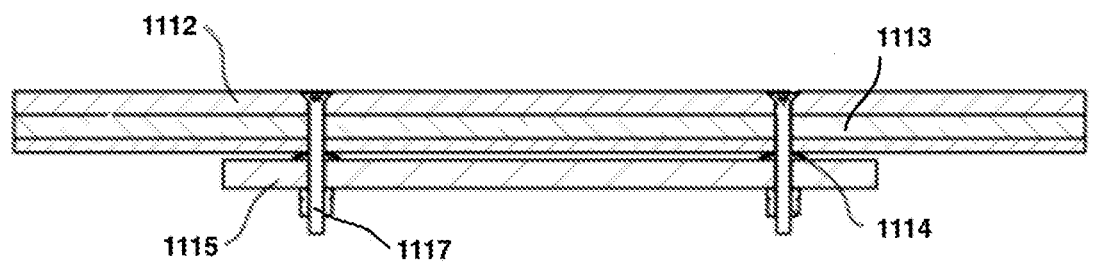
FIG. 3 is a schematic view showing a printing worktable in the present invention.

In the embodiment, the printing worktable 1111 is arranged on a Y-axis slide support of a Y-axis linear motor slide module of the four-axis linkage system 110. Referring to FIG. 3, the printing worktable 1111 has an integral structure including a working surface panel 1112, a heating device 111, a vacuum adsorption device 1110, a cushion elastic washer 1114, and a cushion subplate 1115.

Figure 4:
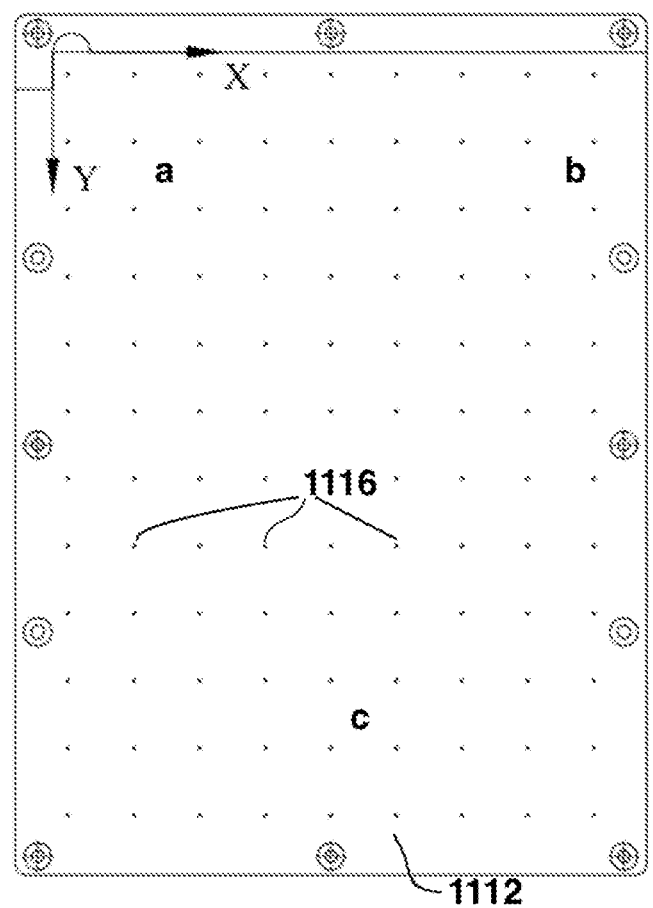
FIG. 4 is a schematic view showing a working surface panel in the present invention.

Referring to FIG. 4, the working surface panel 1112 is a metal heat conducting plate and may be made of an anodized aluminum plate or a stainless steel plate; and the working surface panel 1112 is located on an uppermost layer of the printing platform 1111 for placing the substrate material of the printed flexible microelectronic device. The working surface panel 1112 is provided with a plurality of small holes 1116 which are uniformly arrayed and used for ventilation, and one side edge of the working surface panel 1112 is provided with an X-Y direction reference positioning plate. The X-Y direction reference positioning plate protrudes from an upper surface of the working surface panel 1112 by 100 micrometers to 200 micrometers, and the inner side of the X-Y direction reference positioning plate is provided with an X axial positioning reference surface and a Y axial positioning reference surface which are perpendicular to each other for accurately positioning the substrate material, so that the edge of the substrate material abuts against the two positioning reference surfaces so as to ensure that the positioning error when the substrate material is placed on the printing worktable 1111 is within the interval of 50 micrometers to 100 micrometers.

Referring to FIG. 3, the heating device 111 is disposed at the bottom of the working surface panel 1112 and includes a heating coil and a temperature sensor; the heating device 111, when performing an inkjet printing step according to the printing scheme, performs a heating process on the inkjet print ink and/or the substrate material in response to a control instruction of the control module 12, and controls the temperature of the substrate material and the ink printed on the substrate material to reach a target temperature. For example, when an organic semiconductor layer is formed by the inkjet printing, it is automatically heated to a temperature of 90° C. for 30 minutes.

Referring to FIG. 3, the vacuum adsorption device 1110 is used for adsorbing inkjet printing formed materials and/or substrate materials, arranged below the working surface panel 1112 and comprises at least two heat insulation plates 1113, an air pipe and an air pipe connector; wherein a rectangular hole is hollowed out in the middle of one heat insulation plate 1113 abutting against the working surface panel 1112, the rectangular hole can cover all small holes 1116 in the working surface panel 1112, the working surface panel 1112 and at least two heat insulation plates 1113 below the working surface panel 1112 are fixedly connected by at least four screws, and a sealed hollow cavity structure is formed between the lowest heat insulation plate 1113 and the working surface panel 1112; and the air pipe is connected with the air pipe connector arranged at the bottom of the lowermost heat insulation plate 1113 so as to be communicated with the hollow cavity body, and meanwhile, the air pipe is connected with an external air source and an air pressure control module of the control component 12. The vacuum adsorption device 1110 generates a negative gas pressure in the hollow cavity in response to the gas pressure control module of the control component 12, generates an adsorption force via the small holes 1116 in the working surface panel 1112, and adsorbs and fixes the substrate material on the working surface panel 1112, thereby ensuring that the substrate material is flat and free of warpages.

Referring to FIG. 3, the cushion subplate 1115 is located at the lowermost layer of the printing worktable 1111 and fixedly connected to the Y-axis slide support of the Y-axis linear motor slide module of the four-axis linkage system 110; and the cushion subplate 1115 is fixedly connected with the heat insulation plate 1113 and the working surface panel 1112 in sequence from bottom to top via at least three limit bolts 1117. A plurality of the cushion elastic washers 1114 are sandwiched between the heat insulation plate 1113 and the cushion subplate 1115, and a gap is formed between the heat insulation plate 1113 and the cushion subplate 1115 to isolate heat and prevent most of the heat from being conducted downward.

By adjusting the locking torque of the limit bolt 1117, the upper surface of the working surface panel 1112 is parallel to the X-axis direction of the four-axis linkage system 110, and the cushion elastic washer 1114 is kept in an elastic stressed state all the time. When the working surface panel 1112 is influenced by transportation or external environment vibration, the cushion elastic washer 1114 maintains an elastic buffering state; after the vibration is stopped, the working surface panel 1112 is restored to an original position before the vibration by a limiting action of the limiting bolt 1117 and an elastic force of the cushion elastic washer 1114, so that the printing worktable 1111 has a leveling-free performance. The cushion elastic washer 1114 of the printing worktable 1111 and four elastic feet 114 at the bottom of the base 112 together form a double elastic buffering structure of the microelectronic printer, so that deformation of the working surface panel 1112 caused by external environment vibration can be avoided; and the printing worktable 1111 ensures that the working surface panel 1112 is kept flat all the time in a static state by a leveling operation before the printing worktable 1111 leaves a factory, which avoids complicated steps of user self-adjustment and also errors caused by manual leveling.

In the embodiment, the feeding component 13 is used for switching ink cartridges with different ink solutions to the printing platform 11 for inkjet printing, and is arranged in parallel on one side of the printing platform 11. Referring to FIGS. 1 and 2, the feeding component 13 includes a switching control device 131, a plurality of ink cartridges 133, and a plurality of auxiliary processing components 14. When a printing scheme is executed, the feeding component 13 drives the switching control device 131 to select and move a required ink cartridge 133 or an auxiliary processing component 14 in response to an instruction of the control component 12, and switches the ink cartridge 133 or the auxiliary processing component 14 from the feeding component 13 to the printing platform 11 for corresponding printing or auxiliary processing work; after the corresponding printing operation is completed, the feeding component 13 takes out the ink cartridge 133 or the auxiliary processing component 14 from the printing platform 11 and switches the ink cartridge 133 or the auxiliary processing component 14 back to the feeding component 13 for storage, thereby realizing the function of automatically switching the ink cartridge 133 or the auxiliary processing component 14 of the microelectronic printer.

The switching control device 131 comprises a driving motor, a circular turntable 1313, an electric telescopic rod 1311 and a clamping mechanism 1312. The circular turntable 1313 is arranged at the center of the feeding component 13 and driven by the driving motor to rotate freely by 360 degrees around a center axis; and at least 16 engagement slot positions are arranged on the circular turntable 131 for placing a plurality of ink cartridges 133 containing ink solutions with different material properties and/or auxiliary processing components 14 with different printing process functions. The electric telescopic rod 1311 is arranged above the circular turntable 1313 and linearly moves in the X-axis direction to convey the ink cartridge 133 or the auxiliary processing component 14; and the clamping mechanism 1312 is fixedly arranged at the front end of the electric telescopic rod 1311 for clamping the ink cartridge 133 or the auxiliary processing component 14.

The switching control device 131 is coupled with the control component 12 via a cable line so as to drive the circular turntable 1313 to rotate the ink cartridge 133 for storing the corresponding ink solution or the auxiliary processing component 14 in place according to the current printing step in response to an instruction of the control component 12, and drive the electric telescopic rod 1311 and the clamping mechanism 1312 to clamp and move the ink cartridge 133 or the auxiliary processing component 14 to the printing platform 11, thereby realizing an interchange between different ink cartridges 133 and/or the auxiliary processing component 14.

The ink cartridge 133 and the auxiliary processing component 14 are stored in the switching control device 131. A plurality of the ink cartridges 133 are respectively used for storing different ink solutions for printing different layer structures, so that when the ink solutions are stored in the ink cartridges 133, they need to be consistent with materials configured in a printing scheme to ensure accurate automatic switching so as to complete corresponding printing steps. The auxiliary processing component 14 can be switched with the ink cartridge 133 to complete the corresponding auxiliary processing.

Referring to FIG. 1, the ink cartridge 133 is formed by mechanically connecting an inkstand 1330 and a printhead 1331 via a screw or a buckle or the like. The top of the inkstand 1330 is provided with a clamping and positioning structure, so that the inkstand 1330 can be conveniently positioned by a clamping mechanism 1312 of the switching control device 131; and the printhead 1331 is provided with a magnetic structure so as to be conveniently attracted and fixed with the magnetic structure on the printing platform 11.

The shape of the auxiliary processing component 14 is the same with that of the shape of the ink cartridge 133 in terms of the outline size, the structure size, and the magnetic structure size to ensure interchangeability with the ink cartridge 133.

The auxiliary processing component 14 is constructed by mechanically connecting the inkstand 1330 with an auxiliary processing head via screws or buckles and the like, wherein the auxiliary processing head can be any one of a dispensing head, a scraping head, an infrared sintering head, an ultraviolet sintering head and an ozone processing head, so that different auxiliary processing components 14 contain different auxiliary processing heads to realize different printing treatment functions. The top of the inkstand 1330 is also provided with a clamping and positioning structure, and the auxiliary processing heads are all provided with the same magnetic structure as the printhead 1331.

Further, referring to FIG. 1, the feeding component 13 further includes an inkjet protection device 135 arranged directly below a storage position of the ink cartridge 133 on the circular turntable 1313 for keeping the inside of the printhead 1331 of the ink cartridge 133 wet. The inkjet protection device 135 includes a movable mechanism, a semi-enclosed groove into which an appropriate amount of a corresponding solvent is added, and an elastic sponge-like material within the groove. When the switching control device 131 switches the ink cartridge 133 from the printing platform 11 to be stored in the feeding component 13, the movable mechanism is triggered to lift the groove to be sealed with the printhead 1331 at the bottom of the ink cartridge 133, and the solvent contained in the groove can keep the surface of the printhead 1331 wet so as to prevent an orifice of the printhead 1331 from being blocked after the ink is dried.

In the embodiment, the control module 12 is connected with the printing platform 11 and the feeding component 13 for controlling the feeding component 13 to switch different ink cartridges 133 or auxiliary processing modules 14 to the printing worktable 1111 of the printing platform 11 and realize movement to carry out corresponding printing or auxiliary processing operation so as to complete three-dimensional automatic printing operation of flexible semiconductor electronic parts and components of multi-layer materials or multi-layer integrated circuits.

Referring to FIG. 1, the control module 12 is provided on a base 112 of the printing platform 11, and includes a process drive circuit board for driving inkjet printing and auxiliary process processing, a motion drive circuit board for driving a four-axis motion, a control circuit board for controlling infrared heating, ultraviolet irradiation and ozone generation processing, a power supply module, an air pressure control module, and other drive circuits and modules, and a core control integrated circuit board of the multi-core central processing unit coupled with the driving circuit module to jointly form the control component 12. The drive circuits and modules of the control component 12 are coupled to respective functional components and devices such as inkjet printheads, dispensing heads and scraping heads, heating devices and automatic turning devices. The control component 12 further comprises a power supply interface, a power switch, an air channel interface and a plurality of communication interfaces; the plurality of communication interfaces comprise a network interface, a universal serial bus interface and a USB interface, and a core integrated circuit board coupled to the multi-core central processing unit; the air channel interface is coupled to the air pressure control module; and the power interface and the power switch are coupled to the power module. It should be noted that the description of the various interfaces, such as power supply, air channel, and communication, are for illustrative purposes only and that in other embodiments, the various interfaces in the control component 12 may be increased or decreased as desired.

Figure 5:
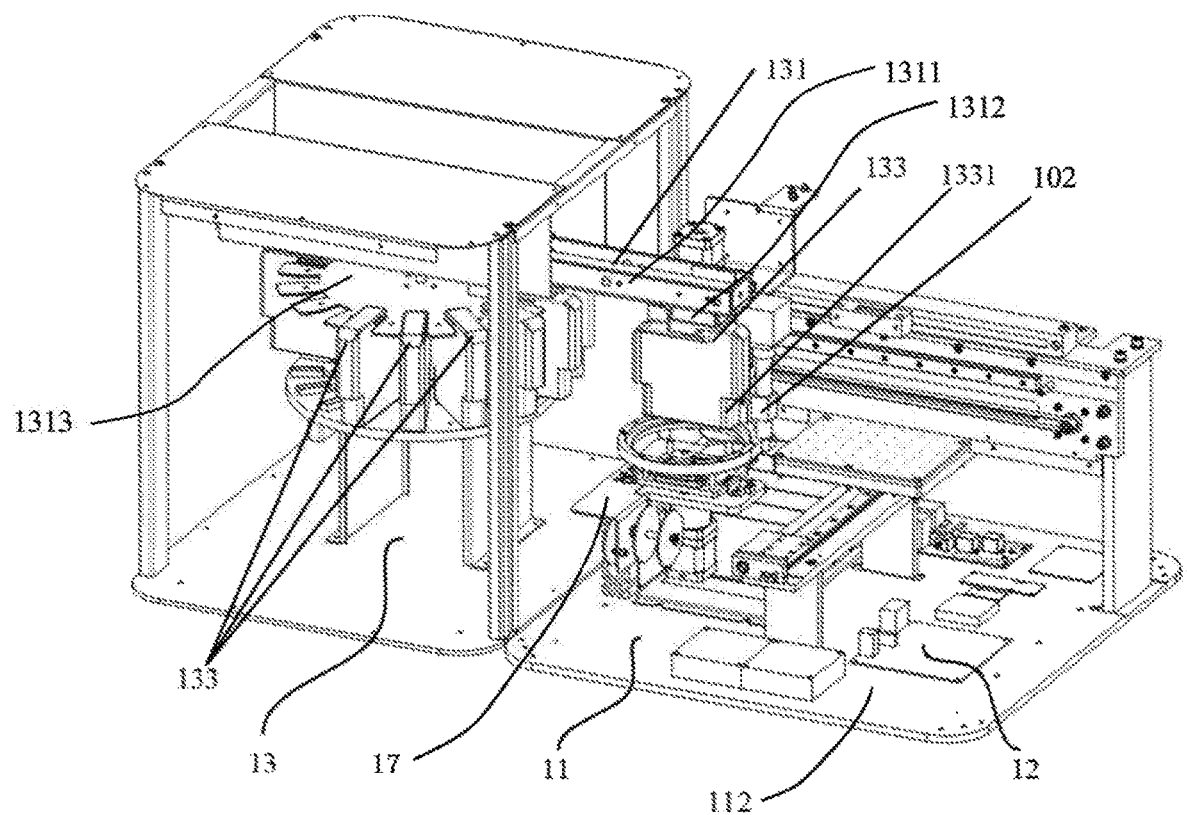
FIG. 5 is a structurally schematic view showing the second embodiment of the present invention.

In the second embodiment of the present invention as shown in FIG. 5, the microelectronic printer of the present invention is basically the same in structure as the first embodiment, and comprises a printing platform 11, a control component 12 and a feeding component 13, with the difference that the printing platform 11 further comprises a rotary cleaning member 17 of the ink cartridge.

The rotary cleaning member 17 of the ink cartridge, an integrated double-function integrated structure, is used for realizing any angle rotation of the ink cartridge 133 and automatic cleaning of the printhead 1331.

Figure 6:
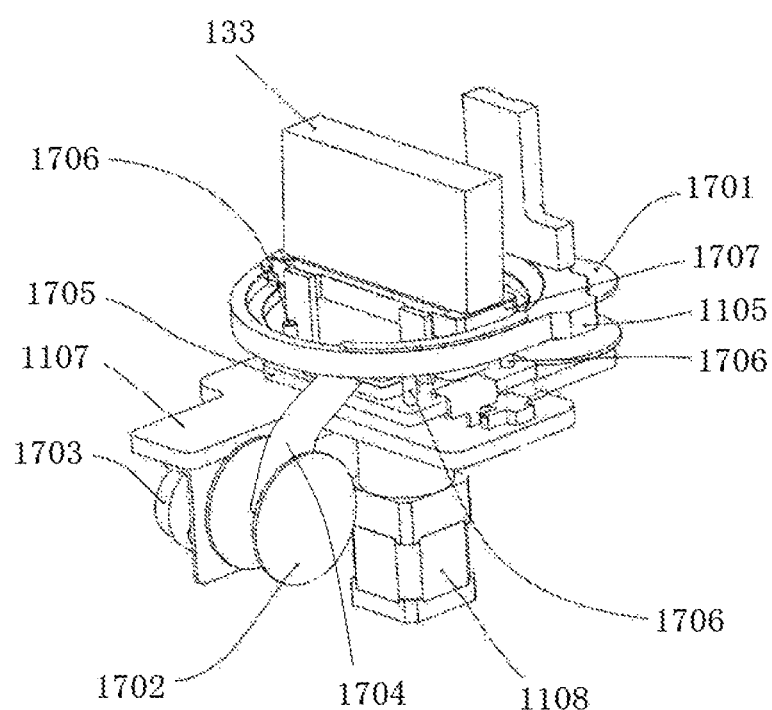
FIG. 6 is a schematic view of a rotary cleaning part of an ink cartridge in the present invention.

Referring to FIGS. 5 and 6, in the embodiment, the rotary cleaning member 17 of the ink cartridge is mounted on a rotating support 1107 of the rotating motor slide module and includes an upper cleaning pulley 1701, a lower cleaning pulley 1702, a direct current motor 1703, a cleaning belt 1704, an ink cartridge rotary disk 1705, at least four cylindrical pins 1706, and an ink cartridge pedestal 1707.

Referring to FIG. 6, the ink cartridge rotating disk 1705 is fixed to a motor shaft of a rotating motor 1108 of the rotating motor slide module and can be driven to rotate by the rotating motor 1108, and the upper surface of the ink cartridge rotating disk 1705 is provided with a cleaning belt channel formed by a belt frame and a press buckle. The cartridge base 1707 is provided for placing the cartridge 133 or the auxiliary processing component 14 on a Z-axis annular support 1105 of a Z-axis linear motor slide module of the four-axis linkage system 110, and is freely rotatable on the Z-axis annular support 1105. The four cylindrical pins 1706, which can be inserted into the ring of the Z-axis annular support 1105 and sandwich the cartridge base 1707 in the middle, are vertically connected to the ink cartridge rotating disk 1705 to be rotatable therewith. When the printer is in a return-to-zero state, the ink cartridge base 1707 can freely rotate in the Z-axis annular support 1105 under a rotating thrust of the cylindrical pin 1706, and the ink cartridge base 1707 can linearly move along the Z-axis with the Z-axis annular support 1105. Meanwhile, the Z-axis linear motor slide module can perform an X-axis motion along with the X-axis linear motor slide module. The bottom of the cartridge base 1707 is provided with a magnetic structure capable of attracting and fixing the cartridge 133 or the auxiliary processing component 14. It should be noted that the rotary cleaning member 17 of the ink cartridge also supports rotation of the auxiliary processing component 14.

The upper cleaning pulley 1701, the lower cleaning pulley 1702, and the direct current motor 1703 are mounted on a rotating support 1107 of the rotating motor slide module, and the lower cleaning pulley 1702 is fixed on a shaft of the direct current motor 1703 and driven by the direct current motor 1703 to rotate; one end of the cleaning belt 1704 is wound in the upper cleaning pulley 1701, and the other end of the cleaning belt 1704 is wound in the lower cleaning pulley 1702; a cleaning belt channel passes through the middle of the ink cartridge rotating disk 1705 and is located below the cartridge base 1707 to wipe a printhead 1331 of the ink cartridge 133 or an auxiliary processing head of the auxiliary processing component 14.

The rotary cleaning member 17 of the ink cartridge is connected to the control component 12 via a cable line and is responsive to an instruction of the control component 12. When the ink cartridge 133 is replaced, the ink cartridge rotating disc 1705 automatically rotates at a certain angle by moving the ink cartridge base 1707 via four cylindrical pins 1706 according to a converted instruction set by the property of the ink solution in the ink cartridge 133 and the parameter setting of the print resolution ratio so as to control the angle during the printing of different ink cartridges 133, adjust the distance between adjacent ink droplets printed on the substrate and control the number of printing ink droplets in the distance per inch so as to control the print resolution ratio and achieve the aim of controlling the inkjet printing precision of different ink solutions. When printhead cleaning is required, a cleaning instruction is executed; a rotating support 1107 of the Z-axis linear motor slide module drives the ink cartridge 133 to descend, so that the printhead 1331 is in contact with the cleaning belt 1704, the cleaning belt 1704 adsorbs residual ink on the printhead 1331; meanwhile, the residual ink is carried away by pulley rotation, so that the printhead 1331 is kept clean, pollution-free and not blocked all the time; therefore, the automatic cleaning of the printhead 1331 in the inkjet printing process is realized, and the purpose of improving the printing quality is achieved. The upper cleaning pulley 1701, the lower cleaning pulley 1702, and the cleaning belt 1704 can be disassembled to facilitate replacement of a new cleaning belt 1704.

Figure 7:
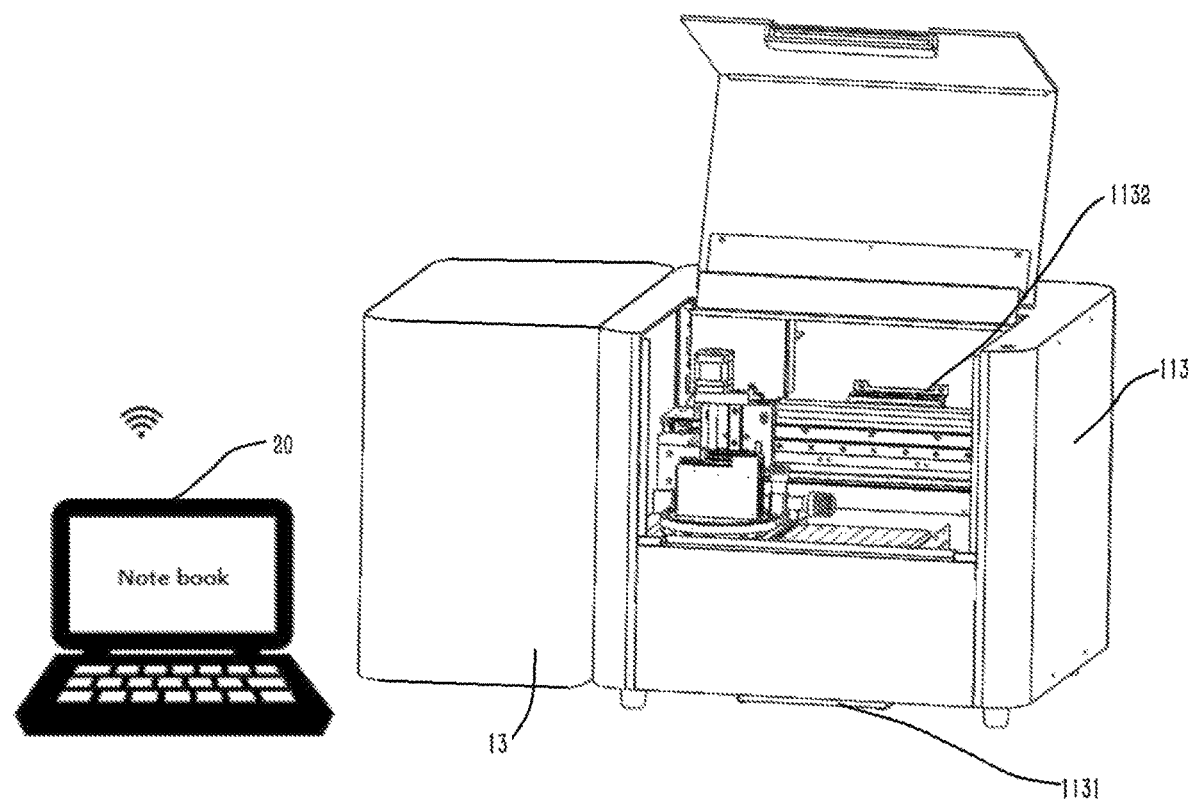
FIG. 7 is a schematic diagram showing the third embodiment of the present invention.
Figure 8:
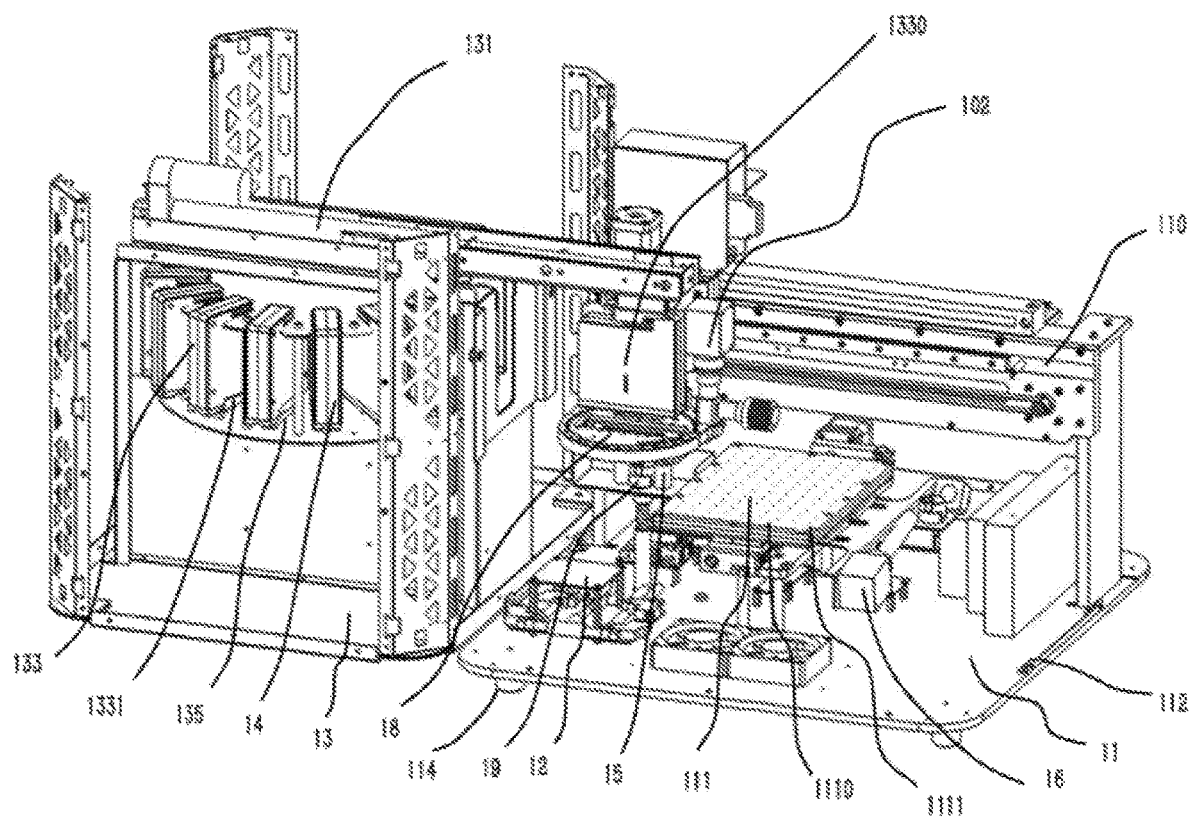
FIG. 8 is a structurally schematic view showing the third embodiment of the present invention with a protective housing removed.

In the third embodiment of the present invention as shown in FIGS. 7 and 8, the microelectronic printer of the present invention comprises a printing platform 11, a control component 12, a feeding component 13, a camera component 15, an ink droplet observation device 16, a machine vision device 102, and a CAD/CAM (Computer aided design and manufacturing system) system 20. Here, the structure of the control component 12 and the feeding component 13 is the same as that of the corresponding members in the first embodiment, and the structure of the printing platform 11 is substantially the same as that of the printing platform 11 in the first embodiment, except that the printing platform 11 in the third embodiment further includes an automatic ink cartridge turning device 18, an automatic cleaning device 19, and a protective housing 113.

In the embodiment, the automatic cleaning device 19 and the automatic ink cartridge turning device 18 are provided separately and independently, and are connected to the control component 12 respectively.

Figure 9:
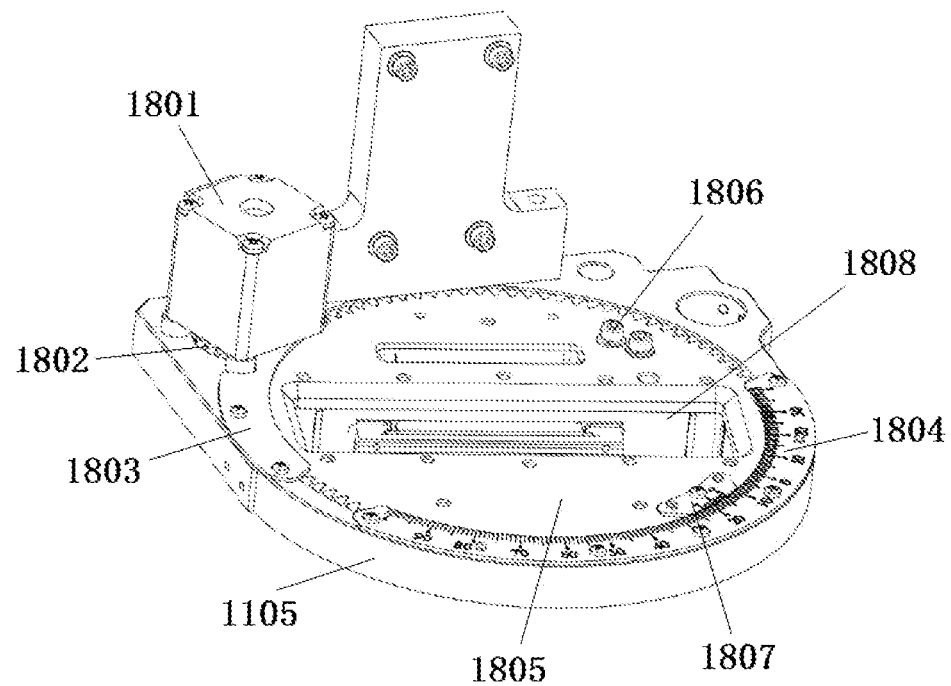
FIG. 9 is a first structurally schematic view showing the automatic ink cartridge turning device of the present invention.
Figure 10:
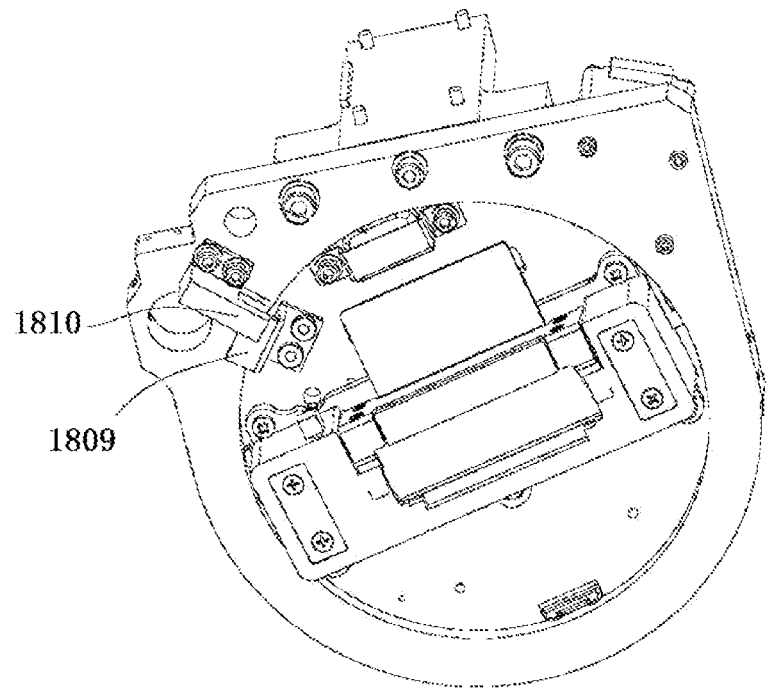
FIG. 10 is a second structurally schematic view of the automatic ink cartridge turning device of the present invention.

Referring to FIGS. 9 and 10, the ink cartridge automatic turning device 18 is provided on a Z-axis annular support 1105 of the Z-axis linear motor slide module for controlling the printing angles of different ink cartridges 133 to indirectly control inkjet printing accuracy of different ink solutions; the ink cartridge automatic turning device 18 includes a stepping motor 1801, a pinion 1802, a big gear 1805, a pressing sheet 1803, a scale sheet 1804, a small scale sheet 1807, an ink cartridge fixing pedestal 1808, a photoelectric induction switch 1810, and a limit sheet 1809.

The stepping motor 1801 is vertically mounted on one side edge of the Z-axis annular support 1105; the big gear 1805 is arranged in a circular ring of the Z-axis annular support 1105 and can rotate; the pressing sheet 1803 and the scale sheet 1804 are fixed on an edge of the circular ring of the Z-axis annular support 1105, causing that the big gear 1805 is limited in the circular ring; the pinion 1802 is connected to a motor shaft of the stepping motor 1801 and is meshed with the big gear 1805; the ink cartridge fixing pedestal 1808 is arranged in the center of the big gear 1805 for placing the ink cartridge 133 or the auxiliary processing component 14; the small scale sheet 1807 is fixed on an edge of the big gear 1805, and the small scale sheet 1807 and the scale sheet 1804 jointly act to indicate the rotation angle of the ink cartridge fixing pedestal 1808; the photoelectric induction switch 1810 is fixed on a lower plane of the Z-axis annular support 1105 via a screw 1806; the limiting sheet 1809 is fixed on a lower plane of the big gear 1805 and acts on the photoelectric induction switch 1810; and when the small scale sheet 1807 is aligned with the scale sheet 1804, and zero setting of the automatic ink cartridge turning device 18 can be realized by adjusting relative positions of the limiting sheet 1809 and the photoelectric induction switch 1810.

When a printing scheme is executed, after the ink cartridge 133 is fixed on the ink cartridge automatic turning device 18 by the switching control device 131, the printhead 1331 establishes a circuit and air channel connection with the ink cartridge automatic turning device 18, and the circuit and the air channel are coupled with the control component 12 so as to realize inkjet printing driving of the printhead 1331.

The CAD/CAM system 20 converts the setting of the ink solution material and the print resolution value into a specific angle value instruction, automatically controls the ink cartridge 133 to rotate by a certain angle by the control component 12 and the ink cartridge automatic turning device 18, so that a connecting line of the centers of all orifices of the printheads 1331 on the ink cartridge 133 forms an included angle $\alpha$ with an X-axis direction, making the distance $dx=d*\cos \alpha$ in the X-axis direction and the distance $dy=d*\sin \alpha$ in the Y-axis direction between the two adjacent orifices with the center distance d. Therefore, the distance between the adjacent ink droplets printed on the substrate in the X-axis direction and the Y-axis direction can be adjusted, the number of printing ink droplets per inch distance can be controlled so as to control the print resolution and the inkjet printing precision of different ink solutions.

The automatic cleaning device 19 is used for automatic cleaning the printing nozzle 1331 during the inkjet printing process Referring to FIG. 6, the automatic cleaning device 19 is provided on a base support of the printing platform 11 below the ink cartridge automatic turning device 18, and the automatic cleaning device 19 is provided with an adsorption filter element capable of adsorbing and cleaning residual ink on the printhead 1331.

Further, in the embodiment, the microelectronic printer further includes a machine vision device 102 for feeding captured images back to the control component 12 for processing so as to monitor printing errors occurring during the inkjet printing process. Referring to FIG. 8, the machine vision device 102 is arranged on a Z-axis annular support 1105 of a Z-axis linear motor slide module of the four-axis linkage system 110 and is connected to the control component 12 via a cable line. The machine vision device 102 is constructed by a camera, which may be a charge coupled device (CCD) camera or a complementary metal oxide semiconductor (CMOS) camera, and a lens.

Responding to an automatic calibration program of the control component 12 and the CAD/CAM system 20 by the machine vision device 102, a printing process of the printhead 1331 is taken as a detection object, and the captured ink images printed on a substrate material is fed back to the control component 12 and the CAD/CAM system 20; the control component 12 and CAD/CAM system 20 perform a comparative analysis process on the ink image data files and the print data files of design drawings to monitor printing errors occurring during the inkjet printing process. The CAD/CAM system 20 converts transmitted signal into a digital signal according to the pixel distribution, the brightness, the color, and the like, and performs various operations on the digital signal to extract image features of the detected object, such as area, number, position, length, etc., and then outputs results according to the preset allowable degree and other process conditions, including size, angle, number, conformity/nonconformity, presence/absence, etc., to realize the automatic recognition function of the printing process. When a printing error is monitored, in response to a control instruction of the control component 12, the inkjet printhead 1331 corrects the original printing step in which the printing error occurs in accordance with a preset correction step, or re-executes the printing step in which the printing error occurs.

The machine vision device 102 is also capable of performing a plane calibration on movement of the Z-axis of the printing worktable 1111 in the X-Y plane by an automatic calibration program within the CAD/CAM system 20. Referring to FIG. 4, when a printer executes a printing program, the automatic calibration program collects Z-axis coordinate values of a, b and c, three farthest apart points, on the working surface panel 1112 of the printing worktable 1111 by the machine vision device 102. A reference plane formed by the three points are calculated based on an algorithm program of the CAD/CAM system 20, and the motion of the Z axis on the X-Y plane is further automatically corrected to ensure that the motion plane of the printhead 1331 on the Z axis on the X-Y plane is always parallel to the reference plane of the three points when each layer is printed, so as to avoid complicated steps that a user adjusts the flatness of the printing worktable 1111 by himself and also errors generated when the user uses manual leveling, so that printing precision and efficiency are improved. It should be noted that three remote locations a, b, c are for illustration purposes only, and in particular implementations, there may be three or more points located furthest apart.

Further, in the embodiment, the microelectronic printer further comprises a camera component 15 for collecting an image of a reference point to correct a position error of the printhead 1331 of the ink cartridge 133. The camera component 15 is constructed by a camera, which may be a CCD camera or a CMOS camera, and a lens. Referring to FIG. 8, the camera component 15 is arranged on a base support of the printing platform 11 and is connected/coupled to the control component 12 via a cable line.

One or more reference points are arranged on the ink cartridge 133 and/or the printhead 1331, the ink cartridge 133 or the printhead 1331 is moved to the ink cartridge automatic turning device 18 by the feeding component 13, and after a printing step is finished, the printhead 1331 returns to an original position; the camera component 15 transmits the collected image of the reference point to the control component 12 and the CAD/CAM system 20, and coordinates of the center of the printhead 1331 are obtained by image recognition and calculation to determine whether the return position of the printhead 1331 has some errors with respect to the standard original position. If the position error of the printhead 1331 is determined to exist, the position error of the printhead 1331 is corrected according to a preset automatic correction scheme, and the printhead 1331 is automatically corrected to the standard original position, so that the microelectronic printer realizes full-automatic multi-layer alignment, and the accuracy of an automatic multi-layer printing process is guaranteed.

Further, in the embodiment, the microelectronic printer further includes an ink droplet observation device 16 for observing an inkjet condition of the printhead 1331 so as to perform optimal setting of inkjet parameters. The ink droplet observation device 16 is constructed by a camera, which may be a CCD camera or a CMOS camera, and a lens. Referring to FIG. 6, the ink droplet observation device 16 is arranged on a Y-axis slide support of a Y-axis linear motor slide module of the four-axis linkage system 110 and is connected to the control component 12 via a cable line.

The ink droplet observation device 16 sends the collected ink drop image when the printhead 133 is used for jetting ink to the control component 12 for analysis processing, the control component 12 sends processing data to the CAD/CAM system 20, and the data is displayed by the CAD/CAM system 20 on a screen of a computer in the form of video images, main ink droplet diameters, satellite ink droplet diameters, ink drop ejection angles and speeds and the like; therefore, a user can observe the inkjet conditions of all the orifices of the printhead 133, optimize the setting of inkjet parameters such as waveform, voltage, air pressure and the like and select the orifices with better inkjet to carry out inkjet printing so as to achieve the purpose of improving the printing quality.

Further, the printing platform 11 further includes a protective housing 113 arranged on the outside of the printing platform 11 for enclosing the printing platform 11 and components therein so as to prevent external dust and foreign matters from entering the printer and remove fine particulate matters and volatile gas odors in the air inside the printer.

Referring to FIG. 7, in the embodiment, the protective housing 113 is fixed to the base 112 by screws. The protective housing 113 includes an inlet filter component 1131 and an outlet filter component 1132.

The inlet filter component 1131 is provided at the bottom of the protective housing 113 and includes an inlet fan, a high-efficiency particulate air filter, and a metal frame. The metal frame is provided with an elastic pressing structure fixed with the base 112 via screws, and the high-efficiency air filter is arranged between the inlet fan and the metal frame; and the high-efficiency air filter is fixed by the elastic pressing structure on the metal frame without fixing screws, and therefore can be conveniently disassembled and replaced.

The outlet filter component 1132 is provided at the back of the protective housing 113 and includes an outlet fan, a high-efficiency particulate air filter, activated carbon particles, and a metal frame. An elastic pressing structure is arranged on the metal frame and is fixed with the back of the protective housing 113 via screws, and the high-efficiency air filter and the activated carbon particles are arranged between the outlet fan and the metal frame and are fixed via the elastic pressing structure without fixing screws, and thus can be conveniently disassembled and replaced.

The inlet filter component 1131 and the outlet filter component 1132 are capable of removing fine particulate matters (PM 2.5) having a diameter of 2.5 microns or less and volatile gas odors from the air.

Still further, in the embodiment, the microelectronic printer further includes a computer-aided design and manufacturing system (CAD/CAM system) 20. See FIG. 7. The CAD/CAM system 20 is mounted on a computer and communicatively coupled to the control component 12 for issuing an instruction to the control component 12.

The CAD/CAM system 20 can assist in designing semiconductor electronic parts and components and multi-layer integrated circuit diagrams, designing ink solution materials, substrate materials, and printing process related parameters, converting the drawings and parameters into print data via an algorithmic program, sending a print data instruction to the control component 12, and controlling the operation of an integral system of the microelectronic printer. The printing process related parameters include an attribute value of the printing ink solution material and the substrate material, a heating temperature value and a heating time value of the heating device 111, a heating temperature value and a heating time value of the printhead 1331, an operating air pressure value and a time value for maintaining the air pressure of the printhead 1331, the dispensing head, the scraping head and the vacuum adsorption device 1110, a time value for ozone generation of the ozone processing head, a pore diameter value of the dispensing head and an operating width value of the scraping head, an ultraviolet irradiation crosslinking curing time value, and a driving voltage value, a waveform slope value, a waveform cycle time value and a print resolution value of the printhead 1331, a printhead height value, a printing speed value, a substrate material thickness value, an automatic cleaning time value, a cleaning frequency value, and camera parameters of the camera component 15, the ink droplet observation device 16 and the machine vision device 102, etc.

In the embodiment, the control component 12 is coupled to the four-axis linkage system 110, the heating device 111, the vacuum adsorption device 1110, the automatic ink cartridge corner device 18, the automatic cleaning device 19, the switching control device 131, the machine vision device 102, the camera component 15, and the ink droplet observation device 16 via cabling, and the control component 12 is responsive to data commands sent by the CAD/CAM system 20. and controlling the feeding component 13 to select and Switching the required ink cartridge 133 or the auxiliary processing component 14, moving to the automatic ink cartridge turning device 18 of the printing platform 11, and driving the ink cartridge 113 or the auxiliary processing component 14 through the four-axis linkage system 110 to automatically perform inkjet printing and auxiliary process processing (dispensing, scraping, heating, ultraviolet irradiation and the like) operation on the printing platform 11 while passing through the machine vision device 102; the camera component 15 and the ink droplet observation device 16 control the quality of printing.

According to the embodiment, full automation and various printing processes of the microelectronic printer are operated as follows.

Referring to FIG. 7, the CAD/CAM system 20 converts the designed semiconductor electronic parts and components or a multi-layer integrated circuit structure diagram and the relevant parameters of the printing process phase via an algorithmic program to generate printing data and an instruction then sent to the control module 12, which controls the feeding component 13. The different ink cartridges 133 or auxiliary processing component 14 are switched and fixed to the cartridge automatic turning device 18 by the switching control device 131, and are moved on the printing worktable 1111 in response to the instruction of the control component 12; and the movement is in a space represented by the X/Y/Y axis three-dimensional Cartesian coordinate system of the printing worktable 11. Meanwhile, the printhead 1331 or the auxiliary processing component 14 of the ink cartridge 133 performs different printing processes and auxiliary processes in response to the instruction of the control component 12.

One example of application is an organic semiconductor transistor printed by the microelectronic printer of the embodiment of the present invention. Firstly, the feeding component 13 switches an ink cartridge 133 storing a silver electrode ink solution to the printing platform 11, prints on a substrate material to form a grid layer, automatically responds to related printing parameters, and heats and cures the substrate and the ink solution printed on the substrate. Secondly, a step of printing a dielectric layer is executed, the feeding component 13 switches the auxiliary processing component 14 containing the polyvinylpyrrolidone (PVP) ink solution in the scraping head to the automatic ink cartridge turning device 18, inkjet on the grid layer and scraping process are carried out to form the dielectric layer, and the ink solution printed on the substrate is heated and cured automatically in response to related printing parameters; the feeding component 13 is switched into an ink cartridge containing the silver electrode ink solution again, a source drain electrode layer is formed on the dielectric layer by the inkjet printing process, and also the substrate and the ink solution printed on the substrate are heated and cured in automatic response to related printing parameters; the feeding component 13 is switched into an auxiliary processing component 14 of a dispensing head for storing an ink solution of an organic semiconductor material, an organic semiconductor layer is formed in a dispensing process by inkjetting at a channel position between a source electrode and a drain electrode, the feeding component 13 is switched into an auxiliary processing component 14 containing an ultraviolet sintering head in automatic response to related printing parameters, and the ink solution printed on the substrate is subjected to ultraviolet crosslinking curing treatment; each time the ink cartridge is switched, the microelectronic printer automatically corrects a position error of the printhead 1331 and automatically aligns the positions of the multi-layer printing reference points by the camera component 15 and the machine vision device 102, simultaneously monitors printing errors in the inkjet printing process and corrects or re-executes printing steps with errors so as to realize the full-automatic inkjet printing of the organic semiconductor transistor multi-layer structure with multiple printing processes.

The second example of application of the embodiment is that, after a photosensitive resin layer is formed by the inkjet printing, the photosensitive resin layer is rapidly cured by ultraviolet irradiation; when an organic light-emitting diode is formed by the inkjet printing, an orifice of the printhead 1331 is controlled to automatically spray an organic semiconductor ink solution on an indium tin oxide (ITO) electrode, and a scraping head is controlled to scrape and coat the ITO electrode to form an organic semiconductor layer;

then a dispensing head is controlled to print to form a liquid metal layer; and after the inkjet printing of the multi-layer device, the device is cleaned with a gas such as ozone.

In the present invention, the full-automatic microelectronic printer comprising a printing platform, a control component, a feeding component, a camera component, a machine vision device, an ink droplet observation device, and a CAD/CAM system. The printing platform comprises a four-axis linkage system, a printing worktable, a base, a protective housing, an automatic ink cartridge turning device, and an automatic cleaning device; the feeding component comprises a switching control device, an ink cartridge, and an auxiliary processing component; the control component comprises a core control integrated circuit board, a plurality of drive control circuit boards, and a control module interface. The feeding component switches the ink cartridges with different ink solutions and the auxiliary processing components with different process functions to the printing platform according to a current printing step in response to the control component, the control component drives the ink cartridges and the auxiliary processing components to print, and the protective housing removes fine particles and gas odors. CAD/CAM system assists in designing semiconductor electronic parts and components and multi-layer integrated circuit diagrams, generates and send a printing instruction to the control component, and devices such as a printing platform, and controls the feeding component and the like to operate so as to realize full-automatic printing of a multi-layer material structure with multiple printing processes.

The above descriptions are preferred embodiments but do not serve to limit the scope of protection for the present invention. For those skilled in the art, various changes and modifications may be made to the present invention within the spirit and principles of the present invention.

We claim:

1. A full-automatic microelectronic printer, comprising a printing platform, a control component, and a feeding component, wherein the printing platform comprises a four-axis linkage system, a printing worktable, and a base; the four-axis linkage system is arranged on the base and comprises a rotating motor slide module capable of performing rotating motion, an X-axis linear motor slide module, a Y-axis linear motor slide module, and a Z-axis linear motor slide module, and the X-, Y-, and Z-axis linear motor slide modules are perpendicular to one another and capable of performing a three-dimensional space motion; the rotating motor slide module is arranged on the base and comprises a rotating support and a rotating motor; the X-axis linear motor slide module is arranged on the base and comprises an X-axis slide support; the Y-axis linear motor slide module is arranged on the base and comprises a Y-axis slide support; and the Z-axis linear motor slide module is arranged on the X-axis slide support and comprises a Z-axis annular support; the printing worktable is arranged on the four-axis linkage system and is an integral structure comprising a working surface panel, a heating device, a vacuum adsorption device, a cushion elastic washer and a cushion subplate; the working surface panel is arranged on an uppermost layer, a plurality of small holes which are uniformly arrayed are arranged on the working surface panel for ventilation, and an X-Y direction reference positioning plate is arranged on one side edge of the working surface panel wherein the X-Y direction reference positioning plate is configured to position the substrate material; the heating device comprises a heating coil and a temperature sensor that are arranged at the bottom of the working surface panel, wherein the heating device is configured to heat printing ink and the substrate material; the vacuum adsorption device comprises at least two heat insulation plates stacked and fixedly connected below the working surface panel, a rectangular hole covering all small holes in the working surface plate is arranged in the middle of the heat insulation plate close to the working surface plate, a sealed hollow cavity is formed between the heat insulation plate at a bottommost layer and the working surface plate, and the sealed hollow cavity is communicated with an external air source by an air pipe to form a negative air pressure in the hollow cavity, wherein the small holes are configured to adsorb the substrate material; the cushion subplate is positioned at lowest layer and fixedly connected to the Y-axis slide support, and is sequentially fixedly connected with the heat insulation plate and the working surface panel from bottom to top, and the cushion elastic washer is clamped between the heat insulation plate and the cushion subplate so as to form a gap for preventing heat conduction therebetween;

the feeding component is arranged in parallel on one side of the printing platform and comprises a switching control device, a plurality of ink cartridges, and a plurality of auxiliary processing components, wherein the feeding component is configured to automatically switch the ink cartridges with different ink solutions and the auxiliary processing components with different process functions to be sent to the printing platform;

the switching control device comprises a driving motor, a circular turntable positioned in the center, an electric telescopic rod positioned above the circular turntable and a clamping mechanism;

the driving motor is configured to drive the circular turntable to make 360-degree free rotation around a center axis, at least 16 engagement slots are arranged on the circular turntable, and a plurality of ink cartridges containing ink solutions with different material properties and auxiliary processing components with different printing process functions are arranged in the engagement slots;

the ink cartridge comprises an inkstand and a printhead which are connected with each other, the auxiliary processing component comprises an inkstand and an auxiliary processing head which are connected with each other, the shape of the auxiliary processing component is the same as that of the ink cartridge, and the auxiliary processing component can be interchangeably installed with the ink cartridge; the electric telescopic rod moves linearly along the X-axis direction to convey the ink cartridge or the auxiliary processing component, and the clamping mechanism is fixedly arranged at a front end of the electric telescopic rod and is used for clamping and fixing the ink cartridge or the auxiliary processing component;

the control component is arranged on the base of the printing platform and connected with the printing platform and the feeding component, wherein the control component controls the feeding component to switch and move different ink cartridges or auxiliary processing components to the printing platform and the printing platform to realize corresponding inkjet printing or auxiliary process treating operations so as to complete three-dimensional full-automatic printing of the multi-layer flexible microelectronic device; the control component comprises a core control integrated circuit board of a multi-core central processing unit, and a process drive circuit board, a motion drive circuit board, a control circuit board, a power supply module, an air pressure control module, a power interface, a power switch, and a plurality of communication interfaces coupled with the core control integrated circuit board;

the process drive circuit board is connected with the ink cartridge and the auxiliary processing component, wherein the process drive circuit board is configured to drive the inkjet printing and the auxiliary processing process;

the motion drive circuit board is connected with the four-axis linkage system and the switching control device, wherein the motion drive circuit board is configured to drive the three-dimensional four-axis motion of the printing worktable and the switching transfer motion of the ink cartridge or the auxiliary processing component;

the control circuit board is connected with the heating device, wherein the control circuit controls the heating processing of the substrate material; the power supply module is connected with the power interface and the power switch for controlling the on-off of the power supply; and the air pressure control module is connected with the vacuum adsorption device, wherein the air pressure control module controls adsorption and fixation to the substrate material.

2. The microelectronic printer of claim 1, wherein the printing platform further comprises a rotary cleaning member of the ink cartridge; the rotary cleaning member of the ink cartridge is an integrated double-function integrated structure for realizing any angular rotation of the ink cartridge and automatic cleaning of the printhead; the rotary cleaning member of the ink cartridge is mounted on a rotating support of a rotating motor slide module and comprises an upper cleaning pulley, a lower cleaning pulley, a direct current motor, a cleaning belt, an ink cartridge rotating disc, at least four cylindrical pins and an ink cartridge pedestal; the ink cartridge pedestal is arranged on a Z-axis annular support of the Z-axis linear motor slide module, the ink cartridge or the auxiliary processing component is attracted and fixed by a magnetic structure at the bottom, the ink cartridge rotating disc is fixed on a shaft of the rotating motor of the rotating motor slide module, and the four cylindrical pins are vertically fixed on the ink cartridge rotating disc, and upwards inserted into an annular ring of the Z-axis annular support to clamp the ink cartridge pedestal in the middle; wherein the rotating motor is capable of driving the ink cartridge rotating disc to perform a rotating motion, and the ink cartridge pedestal is capable of performing the rotating motion in the Z-axis annular support under the action of a rotary thrust of the cylindrical pin; and the ink cartridge pedestal is capable of performing a Z-axis linear motion along with the Z-axis annular support and perform an X-axis motion along with the X-axis linear motor slide module; the upper cleaning pulley, the lower cleaning pulley and the direct current motor are mounted on the rotating support, wherein the direct current motor is capable of driving the lower cleaning pulley to rotate, so that a cleaning belt with one end wound in the upper cleaning pulley is driven to pass through a cleaning belt channel on an upper surface of the ink cartridge rotating disc so as to wipe and clean the printhead; and the rotary cleaning member of the ink cartridge is connected with the control component, wherein the rotary cleaning member of the ink cartridge is configured to drive the ink cartridge pedestal to rotate by a certain angle in response to an instruction of the control component so as to automatically control print resolutions of different ink cartridges during the printing, and the control component is configured to control the rotatory cleaning member to automatically clean the printhead.

3. The microelectronic printer of claim 1, wherein the printing platform further comprises an automatic ink cartridge turning device and an automatic cleaning device which are respectively independent in structure;

the automatic ink cartridge turning device is arranged on the Z-axis annular support and comprises a stepping motor, a pinion, a big gear, a pressing sheet, a scale sheet, a small scale sheet, an ink cartridge fixing pedestal, a photoelectric induction switch and a limiting sheet; the stepping motor is mounted on one side edge of the Z-axis annular support, the pressing sheet and the scale sheet are fixed on an edge of a circular ring of the Z-axis annular support, and the big gear is limited in the circular ring and can rotate;

the ink cartridge fixing pedestal is used for placing the ink cartridge or the auxiliary processing component and is arranged in the center of the big gear;

wherein the stepping motor is capable of rotating the angle of the ink cartridge fixing pedestal by a meshed pinion and big gear;

the small scale sheet is fixed on an edge of the big gear, the small scale sheet and the scale sheet jointly indicate the rotation angle of the ink cartridge fixing pedestal;

the photoelectric induction switch is fixed on a lower plane of the Z-axis annular support;

the limiting sheet is fixed on a lower plane of the big gear and acts on the photoelectric induction switch; and zero setting of the automatic ink cartridge turning device can be realized by adjusting relative positions of the limiting sheet and the photoelectric induction switch;

the automatic cleaning device is arranged on a base support of the printing platform and below the automatic ink cartridge turning device, and an adsorption filter element capable of adsorbing residual ink is arranged on the automatic cleaning device; and the automatic ink cartridge turning device is connected with the control component wherein the automatic ink cartridge turning device is capable of automatically controlling rotating angles of different ink cartridges in response to an instruction of the control component so as to improve inkjet printing precision, and the automatic cleaning device is connected with the control component, wherein the automatic cleaning device is capable of automatically cleaning the printhead in response to the instruction of the control component.

4. The microelectronic printer of claim 1, wherein the printing platform further comprises a protective housing fixed on the base, sealed outside the printing platform, and the protective housing is capable of removing odor or fine particles and gas in the air inside the printer;

the protective housing comprises an inlet filtering component and an outlet filtering component, the inlet filtering component is arranged at the bottom of the protective housing and comprises an inlet fan, a high-efficiency air filter and a metal frame, and the outlet filtering component is arranged at the back of the protective housing and comprises an outlet fan, a high-efficiency air filter, activated carbon particles and a metal frame.

5. The microelectronic printer of claim 1, wherein the feeding component further comprises an inkjet protection device arranged on the circular turntable of the switching control device directly below the position where the ink cartridge is stored, and the inkjet protection device comprises a movable mechanism, a semi-closed groove and an elastic sponge-like material in the groove; and a solvent, wherein the solvent is contained in the groove and capable of keeping the surface of the printhead wet.

6. The microelectronic printer of claim 1, wherein the top of the inkstand is provided with a clamping and positioning structure cooperating with a clamping mechanism of the switching control device, and the printhead and a auxiliary processing head are provided with a magnetic structure cooperating with the ink cartridge fixing pedestal of the printing platform.

7. The microelectronic printer of claim 1, wherein the auxiliary processing head is any one of a dispensing head, a scraping head, an infrared sintering head, an ultraviolet sintering head and an ozone processing head.

8. The microelectronic printer of claim 1, further comprising a CAD/CAM system mounted on a computer and communicatively connected to the control component.

9. The microelectronic printer of claim 1, further comprising a machine vision device, wherein the machine vision device is capable of collecting an inkjet print image of the printhead and a position image of the printing worktable, and is arranged on the Z-axis annular support of the Z-axis linear motor slide module, connected with the control component, and composed of a camera and a lens; and the control component is capable of processing an image fed back by the machine vision device, monitoring printing errors, and performing automatic calibration of the printing worktable plane.

10. The microelectronic printer of claim 1, further comprising an ink droplet observation device, wherein the ink droplet observation device is capable of observing an inkjet condition of the printhead so as to perform optimal setting of an inkjet parameter, wherein the ink droplet observation device is arranged on the Y-axis slide support of the Y-axis linear motor slide module, connected with the control component, and composed of a camera and a lens.

11. The microelectronic printer of claim 1, further comprising a camera component connected to the control component, wherein the camera component is capable of collecting an image of a position error of the printhead, and the camera component is arranged on the base support of the printing platform and consisting of a camera and a lens.

12. The microelectronic printer of claim 11, wherein the camera component is a CCD camera or a CMOS camera.

* * * * *